US009996009B2

(12) United States Patent
Park et al.

(10) Patent No.: US 9,996,009 B2
(45) Date of Patent: Jun. 12, 2018

(54) EXTREME ULTRAVIOLET (EUV) EXPOSURE SYSTEM AND METHOD OF MANUFACTURING SEMICONDUCTOR DEVICE USING THE SAME

(71) Applicant: Samsung Electronics Co., Ltd., Suwon-si (KR)

(72) Inventors: Chang-min Park, Hwaseong-si (KR); Myung-soo Hwang, Seoul (KR); Ji-sun Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/464,951

(22) Filed: Mar. 21, 2017

(65) Prior Publication Data

US 2018/0031978 A1 Feb. 1, 2018

(30) Foreign Application Priority Data

Jul. 27, 2016 (KR) .................. 10-2016-0095487

(51) Int. Cl.
*G03B 27/54* (2006.01)
*G03B 27/72* (2006.01)
*G03F 7/20* (2006.01)

(52) U.S. Cl.
CPC ........ *G03F 7/70033* (2013.01); *G03F 7/7005* (2013.01); *G03F 7/7045* (2013.01); *G03F 7/70466* (2013.01)

(58) Field of Classification Search
CPC ............ G03F 7/70033; G03F 7/7005; G03F 7/70425; G03F 7/7045; G03F 7/70466

USPC ...................................... 355/37, 67
See application file for complete search history.

(56) References Cited

U.S. PATENT DOCUMENTS

| | | | |
|---|---|---|---|
| 6,716,570 B2 | 4/2004 | Nagarajan et al. |
| 7,399,981 B2 | 7/2008 | Cheymol et al. |
| 8,124,319 B2 | 2/2012 | Huang et al. |
| 8,129,080 B2 | 3/2012 | Fonseca et al. |
| 8,493,548 B2 | 7/2013 | Ivanov et al. |
| 8,574,810 B2 | 11/2013 | Fonseca et al. |
| 8,592,787 B2 | 11/2013 | Moriya et al. |
| 8,734,904 B2 | 5/2014 | Cheng et al. |

(Continued)

FOREIGN PATENT DOCUMENTS

| | | |
|---|---|---|
| JP | 4421268 | 2/2010 |
| JP | 2013-201227 | 10/2013 |

(Continued)

*Primary Examiner* — Colin Kreutzer
(74) *Attorney, Agent, or Firm* — Muir Patent Law, PLLC

(57) ABSTRACT

An extreme ultraviolet (EUV) exposure system capable of improving the yield of an EUV exposure process by improving EUV exposure performance, and furthermore, capable of increasing throughput or productivity of the EUV exposure process, the EUV exposure system including an EUV exposure apparatus configured to perform EUV exposure on a wafer disposed on a chuck table, a load-lock chamber combined with the EUV exposure apparatus and configured to supply and discharge the wafer to/from the EUV exposure apparatus, and an ultraviolet (UV) exposure apparatus configured to perform UV exposure by irradiating an entire upper surface of the wafer with a UV light without using a mask.

17 Claims, 10 Drawing Sheets

(56) References Cited

U.S. PATENT DOCUMENTS

| | | | |
|---|---|---|---|
| 2004/0265748 A1 | 12/2004 | Bristol et al. | |
| 2009/0251678 A1* | 10/2009 | Ohishi | G03B 27/58 355/72 |
| 2011/0117492 A1* | 5/2011 | Yamada | H01L 21/67109 430/270.1 |
| 2015/0241783 A1* | 8/2015 | Carcasi | H01L 21/0271 430/324 |
| 2016/0048080 A1 | 2/2016 | deVilliers | |
| 2017/0031245 A1* | 2/2017 | Nagahara | G03F 7/20 |

FOREIGN PATENT DOCUMENTS

| | | | |
|---|---|---|---|
| JP | 2013-243354 | 12/2013 | |
| WO | WO 2015098596 A1 * | 7/2015 | G03F 7/20 |

* cited by examiner

EXTREME ULTRAVIOLET (EUV) EXPOSURE SYSTEM AND METHOD OF MANUFACTURING SEMICONDUCTOR DEVICE USING THE SAME

CROSS-REFERENCE TO RELATED APPLICATION

This application claims the benefit of priority under 35 U.S.C § 119 to Korean Patent Application No. 10-2016-0095487, filed on Jul. 27, 2016, in the Korean Intellectual Property Office, the disclosure of which is incorporated herein in its entirety by reference.

BACKGROUND

The present disclosure relates to an exposure system, for example, to an extreme ultraviolet (EUV) exposure system performing exposure by using extreme ultraviolet (EUV) light.

Transmission-type exposure systems that use deep ultraviolet (DUV) light have been widely used as exposure apparatuses. As the integration density of semiconductor devices has improved and line widths thereof has decreased, next-generation lithography technologies have been studied to further improve the resolution of optical lithography. Among them, an extreme ultraviolet (EUV) exposure apparatus that uses EUV light having a shorter wavelength than that of DUV light has been actively developed and is being applied to semiconductor manufacturing processes. In this regard, EUV exposure may use slots with narrow widths and may be performed with optical systems using a scan technology. Therefore, the EUV exposure apparatus may be referred to as a scanner. For example, fields may be scanned on a wafer one by one at a separate time instead of exposing the entire wafer at the same time. The scanning may be performed by simultaneously moving a wafer and a reticle and moving the slots crossing fields.

SUMMARY

Aspects of the inventive concept provide an extreme ultraviolet (EUV) exposure system capable of improving the yield of an EUV exposure process by improving EUV exposure performance, and furthermore, capable of maintaining or increasing throughput or productivity of the EUV exposure process.

According to an aspect of the inventive concept, there is provided an EUV exposure system including an EUV exposure apparatus configured to perform EUV exposure on a wafer disposed on a chuck table, a load-lock chamber combined with the EUV exposure apparatus and configured to supply and discharge the wafer to/from the EUV exposure apparatus, and an ultraviolet (UV) exposure apparatus configured to perform UV exposure by irradiating a UV light to an entire upper surface of the wafer, wherein the UV exposure apparatus does not include a mask holder.

According to another aspect of the inventive concept, there is provided an EUV exposure system including an EUV exposure apparatus configured to perform EUV exposure on a wafer disposed on a chuck table, a first load-lock chamber combined with the EUV exposure apparatus and configured to supply the wafer into the EUV exposure apparatus, a second load-lock chamber combined with the EUV exposure apparatus and configured to discharge the wafer from the EUV exposure apparatus to outside of the EUV exposure apparatus, and a UV exposure apparatus disposed in the EUV exposure apparatus or the second load-lock chamber and configured to perform UV exposure on the wafer.

According to an aspect of the present disclosure, an apparatus includes: an EUV exposure chamber comprising a chuck table, an extreme ultraviolet (EUV) light source configured to emit EUV light and a mask holder being positioned between the EUV light source and the chuck table; and an ultraviolet (UV) light source configured to emit UV light, wherein the EUV light source is positioned to expose a photoresist (PR) layer coated on a wafer to an EUV light emitted from the EUV light source that is transferred via a photomask held by the mask holder, and wherein the UV light source is configured to expose the PR layer to a UV light emitted from the UV light source without using a photomask after the PR layer is exposed to the EUV light.

According to an aspect of the present disclosure, a method of manufacturing a semiconductor device includes steps of coating a photoresist layer on an upper surface of a wafer, exposing the photoresist layer to an extreme ultraviolet light reflected by a photomask, exposing an entire upper surface of the wafer to an ultraviolet light without using a photomask after exposing the photoresist layer to the extreme violet light, and developing the photoresist layer to form a photoresist pattern on the wafer after exposing the entire upper surface of the wafer to the ultraviolet light.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
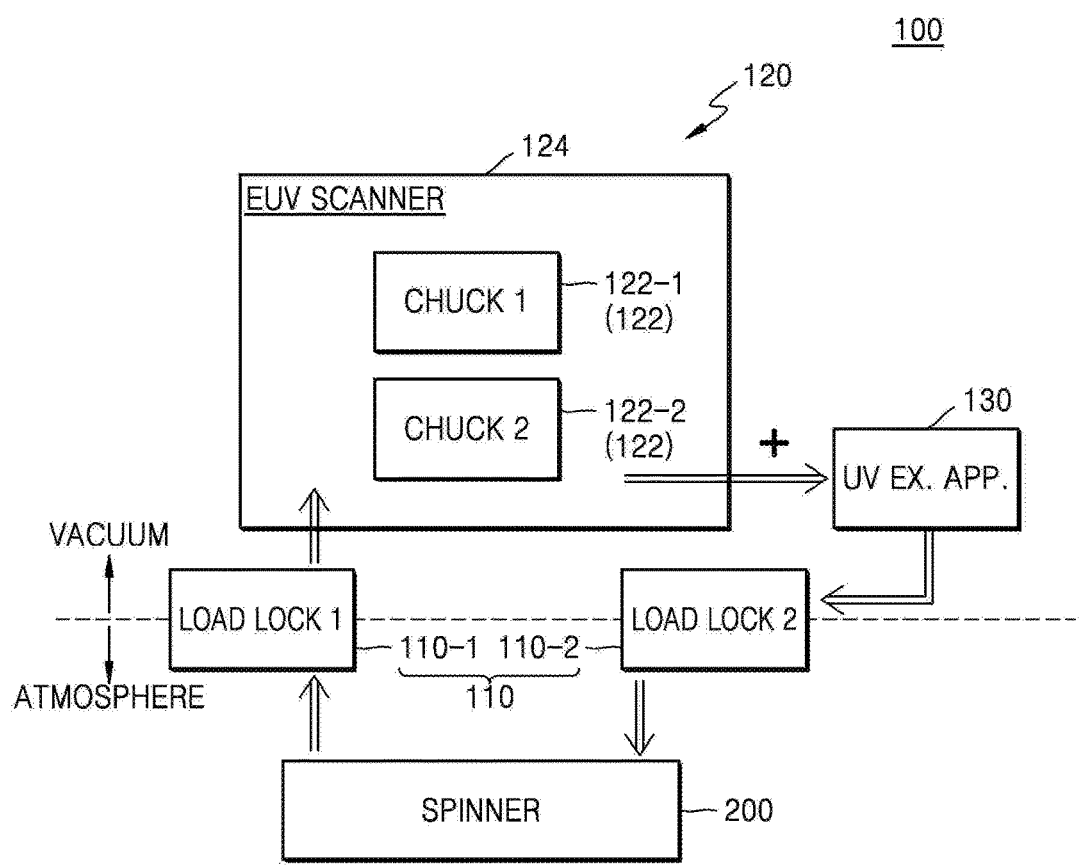
FIG. 1 is a schematic block diagram of an extreme ultraviolet (EUV) exposure system according to an example embodiment of the inventive concept.

Hereinafter, the present disclosure will be described in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

FIG. 1 is a schematic block diagram of an extreme ultraviolet (EUV) exposure system 100 according to an example embodiment of the inventive concept.

Referring to FIG. 1, the exposure system 100 according to the present example embodiment may include a load-lock chamber 110, an EUV exposure apparatus 120, and an ultraviolet (UV) exposure apparatus 130.

The load-lock chamber 110 may function as a path for supplying a wafer from a spinner 200 to the EUV exposure apparatus 120 and discharging the wafer from the EUV exposure apparatus 120 to the spinner 200. The load-lock chamber 110 may be combined with an entrance and/or an exit of an exposure chamber 124 of the EUV exposure apparatus 120, and an atmospheric pressure state and a vacuum state may be alternately maintained in the load-lock chamber 110. The wafer may be a semiconductor substrate on which an EUV photolithography process, for example, EUV exposure, is performed to form a pattern. However, the wafer is not limited to the semiconductor substrate and may be any kind of substrate on which EUV exposure can be performed.

In the process of supplying and discharging the wafer through the load-lock chamber 110, the atmospheric pressure state may be maintained in the load-lock chamber 110 and the wafer may be moved from the spinner 200 to a chuck table 112 (of FIG. 5A) in the load-lock chamber 110 by a loading robot. Next, the atmospheric pressure state in the load-lock chamber 110 may be changed to a vacuum state by a vacuum pump, and the wafer may be moved to a chuck table 122 in the exposure chamber 124 by a scanner loading robot 145 (of FIG. 2). After EUV exposure is performed in the exposure chamber 124, the wafer may be moved to the load-lock chamber 110 in the vacuum state by the scanner loading robot 145. Next, the load-lock chamber 110 may be returned to the atmospheric pressure state and the wafer may be moved to the spinner 200 again by an unloading robot.

As described in FIG. 1, the load-lock chamber 110 may include first and second load-lock chambers 110-1 and 110-2. The first load-lock chamber 110-1 may be combined with the entrance of the exposure chamber 124 and the second load-lock chamber 110-2 may be combined with the exit of the exposure chamber 124. Therefore, the wafer may be supplied to the exposure chamber 124 through the first load-lock chamber 110-1 and may be discharged from the exposure chamber 124 to the spinner 200 through the second load-lock chamber 110-2. In certain embodiments, the load-lock chamber 110 may have a single body. For example, a load-lock chamber 110 may be connected to the exposure chamber 124 with a gate valve between the load-lock chamber 110 and the exposure chamber 124. A wafer may be supplied to the exposure chamber 124 from the load-lock chamber 110 through a gate when the gate valve is open. The wafer may be discharged from the exposure chamber 124 to the load-lock chamber 110 through the gate when the gate valve is open. For example, the wafer may be alternately supplied and discharged via the single load-lock chamber 110.

For example, the spinner 200 may be an apparatus performing a photo-resist (PR) coating process and a developing process on a wafer. The spinner 200 may be a track.

The EUV exposure apparatus 120 may perform EUV exposure on a wafer. For example, a wafer may have a top or upper surface, and a bottom or lower surface opposite the top or upper surface. Semiconductor devices, e.g., transistors, and/or circuitry may be formed on the upper or top surface of the wafer. For example, the EUV exposure may be performed on a photoresist layer formed on the upper surface of a wafer. The EUV exposure apparatus 120 may include a chuck table 122, an EUV light source 121 (of FIG. 3), an optical system 125 (of FIG. 3), and an EUV mask 126 (of FIG. 3) in the exposure chamber 124. The EUV mask 126 may be held by a mask holder included in a mask stage 127 of FIG. 3. FIG. 1 illustrates only the exposure chamber 124 and the chuck table 122 for convenience of illustration.

The chuck table 122 may include first and second chuck tables 122-1 and 122-2. Each of the first and second chuck tables 122-1 and 122-2 may move in an X direction, a Y direction, and/or a Z direction in an XYZ coordinate system. The first chuck table 122-1 may be used for actual exposure and the second chuck table 122-2 may be in a stand by state for exposure. However, since positions of the first and second chuck tables 122-1 and 122-2 may be switched with each other, and/or the first and second chuck tables 122-1 and 122-2 receive wafers alternately, the first chuck table 122-1 may not be differentiated from the second chuck table 122-2. For example, the first chuck table 122-1 may be used for an exposure process of one wafer, and the second chuck table 122-2 may be used for an exposure process of another wafer. For example, the first and second chuck tables 122-1 and 122-2 may be used alternately for exposure processes. The positions of the first and second chuck tables 122-1 and 122-2 may be switched with each other during exposure of multiple wafers, and wafers may be loaded/unloaded to/from both of the first and second chuck tables 122-1 and 122-2. Therefore, EUV exposure may be rapidly progressed. The number of the chuck tables in the exposure chamber 124 is not limited to 2. For example, the exposure chamber 124 may include one chuck table. Alternatively, the exposure chamber 124 may include three or more chuck tables.

Figure 3:
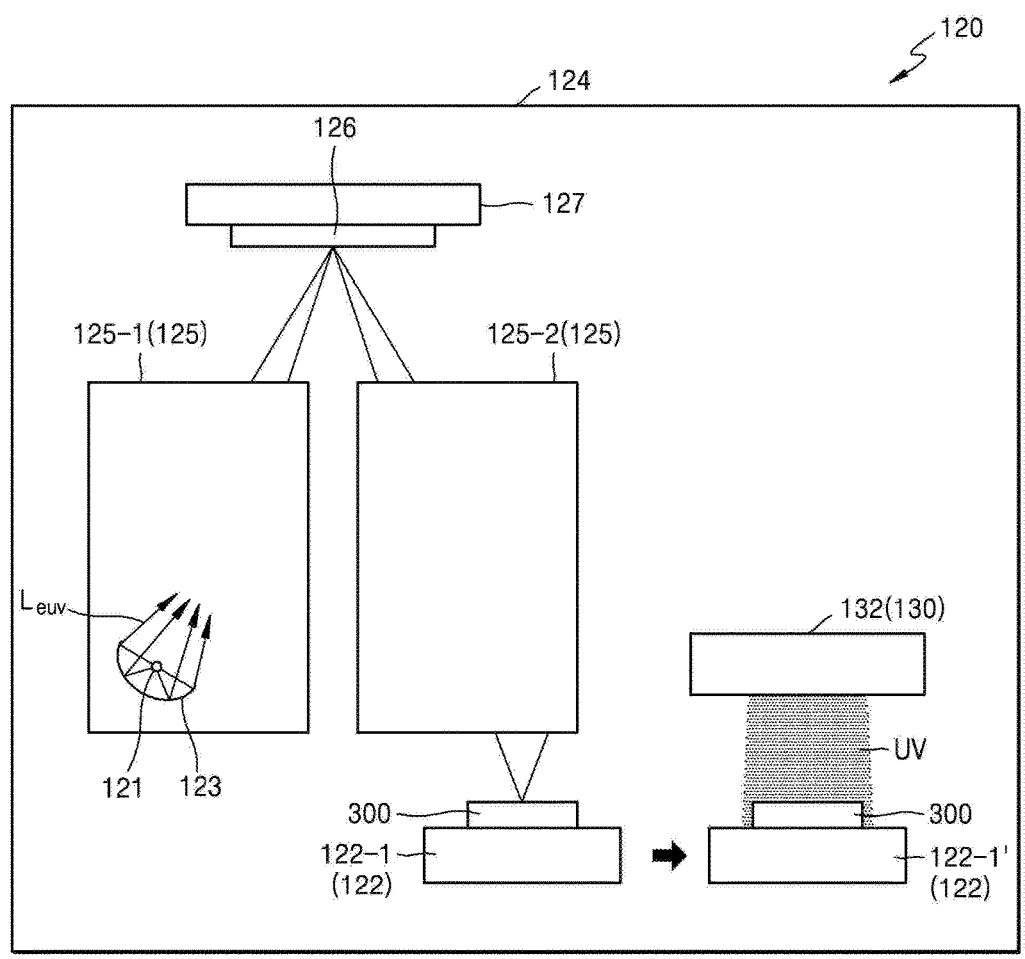
FIG. 3 is a schematic diagram of an example embodiment of forming an ultraviolet (UV) exposure apparatus in an EUV exposure apparatus in the EUV exposure system of FIG. 2 according to an example embodiment of the inventive concept.

In the operation of the EUV exposure apparatus 120, an EUV light generated from the EUV light source 121 may be incident to the EUV mask 126 (of FIG. 3) through an lighting system 125-1 (of FIG. 3) and reflected by the EUV mask 126, and may further irradiate a wafer 300 (of FIG. 3) on the chuck table 122 through a projection system 125-2 (of FIG. 3). A pattern of an EUV mask may be transferred to a PR on a wafer through the exposure. For example, an EUV light reflected by an EUV mask may irradiate a PR layer on a wafer with different intensity per region according to a pattern of the EUV mask. For example, the PR may be divided into an exposure area corresponding to higher intensity and a non-exposure area corresponding to lower intensity, and in the exposure area, chemical characteristics of the PR may be greatly changed due to absorbed light energy. For example, the PR in the exposure area may become soluble to a developer by the EUV light. In certain embodiments, the PR in the exposure area may be changed to be insoluble to a developer by the EUV light. Afterwards, a PR pattern may be formed by removing the exposure area or the non-exposure area during a developing process according to the chemical characteristics of the PR.

The EUV exposure apparatus 120 may perform EUV exposure on a wafer. The UV exposure apparatus 130 may perform UV exposure by irradiating a UV light to the entire upper surface of a wafer without using a mask. For example, the UV exposure apparatus 130 may not have a mask holder configured to hold a photomask between a UV light source and a support configured to support a substrate. For example, the support may be a chuck table. The UV exposure on the entire upper surface of the wafer may also be referred to as UV flood exposure. The UV exposure of the UV exposure apparatus 130 may improve EUV exposure performance in patterning the PR. For example, a PR formed on the upper surface of the wafer may be patterned better by performing the UV exposure on the entire upper surface of the wafer after the EUV exposure is performed. Improvement of the EUV exposure performance through the UV exposure on the entire upper surface of the wafer will be described in detail with reference to FIGS. 8 and 9.

The UV exposure apparatus 130 may have various structures and components. For example, the UV exposure apparatus 130 may be included in the EUV exposure system 100 to perform the UV exposure in-situ with respect to the entire upper surface of the wafer without a photomask after the EUV exposure is performed on the upper surface of the wafer. For example, a PR layer is formed on the entire upper surface of the wafer, and the PR layer is exposed to an EUV light through a photomask. After the EUV exposure, the PR layer is exposed to a UV light without a photomask. The term "in-situ" indicates that the UV exposure on the entire upper surface is performed in a vacuum state. For example, the in-situ UV exposure may be performed in the exposure chamber 124 in which the EUV exposure is performed, without a break in the vacuum state. In certain embodiments, the in-situ UV exposure may be performed in a load-lock chamber after the wafer is transferred from the exposure chamber 124 to the load-lock chamber 110, and before the wafer is transferred from the load-lock chamber 110 to a spinner 200 or another. For example, the UV exposure apparatus 130 may include a UV lamp and may be combined with the EUV exposure apparatus 120 or the load-lock chamber 110. In certain embodiments, the UV exposure apparatus 130 may have a separate chamber structure from the load-lock chamber 110 and the exposure chamber 124, and may include a UV lamp and a chuck table therein. Based on the separate chamber structure, the UV exposure apparatus 130 may be combined with the EUV exposure apparatus 120 to be maintained in a vacuum state when a wafer is moved from the EUV exposure apparatus 120 to the UV exposure apparatus 130.

An EUV exposure process in the EUV exposure system 100 according to the present example embodiment may progress in an order shown by bold arrows in FIG. 1. For example, a wafer on which a PR is coated may be transferred from the spinner 200 to the first load-lock chamber 110-1 and EUV exposure may be performed on the wafer after moving it to the chuck table 122 of the exposure chamber 124. When the EUV exposure is completed, the UV exposure may be performed on the entire top surface of the wafer in the UV exposure apparatus 130, and the wafer may be transferred to the spinner 200 for a developing process after being transferred to the second load-lock chamber 110-2. Regarding the load-lock chamber 110, an upper part with respect to a dashed line in FIG. 1 may be a space wherein a vacuum state is maintained and a lower part with respect to the dashed line may be a space wherein an atmospheric pressure state is maintained. For example, the dashed line crossing the first and second load-lock chambers 110-1 and 110-2 may represent that the first and second load-lock chambers 110-1 and 110-2 may have two different pressure levels (e.g., atmosphere level and a vacuum level) during an EUV exposure process. As described above, the UV exposure may be performed in-situ on the entire top surface of the wafer without a photomask in the UV exposure apparatus 130 along with the EUV exposure with a photomask.

The EUV exposure system 100 according to the present example embodiment may include a UV exposure apparatus capable of performing UV exposure on the entire top surface of wafer. The EUV exposure system 100 according to the present example embodiment may improve EUV exposure performance by performing UV exposure on the entire top surface of wafer on which EUV exposure is performed. Therefore, a yield of an EUV exposure process may be improved.

For example, the EUV exposure system 100 according to the present example embodiment may improve productivity of the EUV exposure system 100 without degradation of a patterning quality. For example, the EUV exposure system 100 of the present embodiment may improve the quality of patterns or may maintain the quality of patterns at the same level as the quality of patterns in existing EUV exposure systems. For example, the EUV exposure system 100 of the present embodiment uses less amount of EUV energy than that of the existing EUV exposure systems by virtue of the improvement of the EUV exposure performance. A reduction in the dose of EUV exposure may contribute to improvement of a process speed of the EUV exposure itself and UV exposure on the entire top surface of the wafer may be performed in-situ, and thus, the entire process time of the EUV exposure system 100 according to the present example embodiment may be the same as or less than an exposure process of prior art. As a result, in the EUV exposure system 100 according to the present example embodiment, throughput or productivity of the EUV exposure process may be improved compared to that of an existing EUV exposure system while maintaining a better quality of PR patterns.

For example, an EUV light source power of currently implementable EUV exposure system may be up to about 80 W. To get a better productivity of the EUV exposure process than the one of, e.g., a DUV exposure system, the power of an EUV light source may need to be 500 W or more without UV flood exposure. Therefore, the competitiveness of mass production of the EUV exposure process compared to liquid immersion lithography is quite limited. However, the EUV exposure system 100 according to the present example embodiment may produce an acceptable or a higher level of patterning quality. The present embodiment may also enhance the productivity of the EUV exposure process by performing EUV exposure at low power together with UV exposure at high power.

Figure 2:
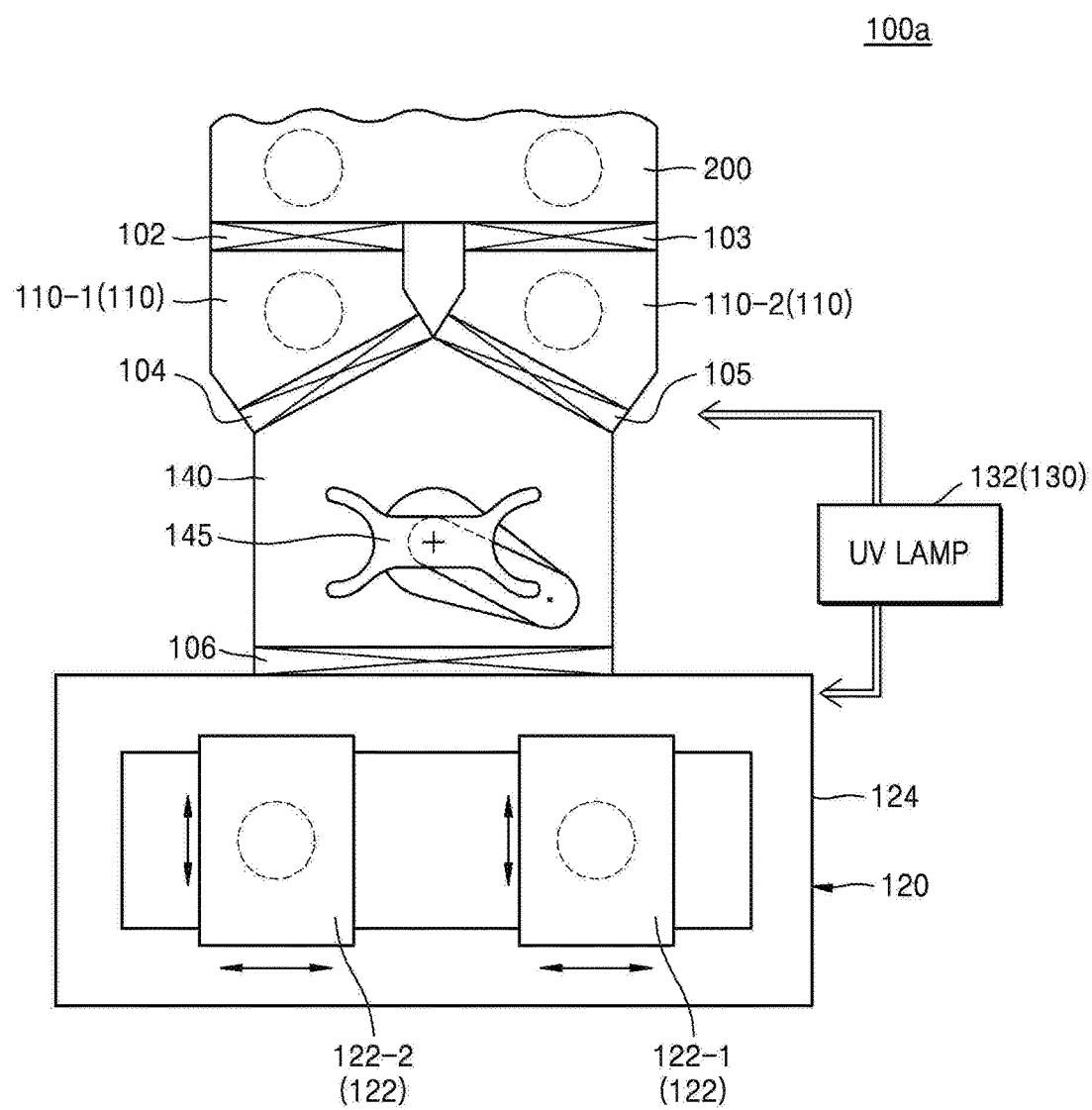
FIG. 2 is an exemplary schematic view of the EUV exposure system of FIG. 1, according to an example embodiment of the inventive concept.

FIG. 2 is an exemplary schematic view of the EUV exposure system 100 of FIG. 1, according to an example embodiment of the inventive concept. In FIG. 2, like reference numerals in FIG. 1 denote like elements, and repeated descriptions thereof are omitted.

Referring to FIG. 2, an EUV exposure system 100a according to the present example embodiment may include a load-lock chamber 110, an EUV exposure apparatus 120, a UV exposure apparatus 130, and a wafer exchange chamber 140. The load-lock chamber 110 and the EUV exposure apparatus 120 are as described in FIG. 1. For example, the load-lock chamber 110 may include the first and second load-lock chambers 110-1 and 110-2, and the EUV exposure apparatus 120 may include the first and second chuck tables 122-1 and 122-2 in the exposure chamber 124.

Dashed circles in FIG. 2 show positions where a wafer is disposed. Gate valves 102 to 106 may be disposed in chambers corresponding to entrances and/or exits, respectively. For example, the input gate valve 102 and the output gate valve 104 may be disposed in the first load-lock chamber 110-1. The input gate valve 105 and the output gate valve 103 may be disposed in the second load-lock chamber 110-2. The input/output gate valve 106 may be disposed in the exposure chamber 124. The spinner 200 may be combined with the input gate valve 102 of the first load-lock chamber 110-1 and the output gate valve 103 of the second load-lock chamber 110-2.

The wafer exchange chamber 140 may be combined with the first load-lock chamber 110-1 through the output gate valve 104, be combined with the second load-lock chamber 110-2 through the input gate valve 105, and be combined with the exposure chamber 124 through the input/output gate valve 106. The wafer exchange chamber 140 may include a robot 145 for moving a wafer. The robot 145 may be used in a vacuum state and may have dual ends. For example, the robot 145 may include a holding arm having two wafer loaders opposite each other, and each of the two wafer holders may have two branches as shown in FIG. 2. However, a structure of the robot 145 is not limited thereto. For example, the robot 145 may have a single end, e.g., one wafer loader. In certain embodiments, other carriers may be used instead of the robot 145.

The robot 145 may transfer a wafer from the first load-lock chamber 110-1 to the second chuck table 122-2 in a stand-by mode in the exposure chamber 124. For example, the stand-by mode is a waiting state while another wafer is subject to EUV exposure loaded on the first chuck table 122-1. The robot 145 may transfer a wafer on which EUV exposure has been performed from the exposure chamber 124 to the second load-lock chamber 110-2. In certain embodiments, the UV exposure apparatus 130 may be disposed in the exposure chamber 124. When the UV exposure apparatus 130 is disposed in the exposure chamber 124, the robot 145 may transfer a wafer that is exposed to EUV with a photomask, and to UV without a photomask on the entire top surface, from the exposure chamber 124 to the second load-lock chamber 110-2.

A wafer alignment may be performed by an alignment unit in the first load-lock chamber 110-1 before a wafer is transferred from the first load-lock chamber 110-1 to the second chuck table 122-2. For example, the wafer may be repositioned on the robot 145 before the wafer is transferred to the second chuck table 122-2 from the first load-lock chamber 110-1.

The UV exposure apparatus 130 may include a UV lamp 132 generating and outputting a UV light, and the UV lamp 132 may be disposed in the exposure chamber 124 or in the second load-lock chamber 110-2 as indicated by a bold arrow in FIG. 2. In certain embodiments, the UV exposure apparatus 130 includes at least two lamps generating lights having different wavelengths. For example, the at least two lamps may be used simultaneously or alternately. The structure of disposing the UV lamp 132 in the exposure chamber 124 will be described in detail with reference to FIGS. 3 and 4, and the structure of disposing the UV lamp 132 in the second load-lock chamber 110-2 will be described in detail with reference to FIGS. 5A to 6.

When the UV lamp 132 is disposed in the exposure chamber 124, EUV exposure may be performed on a wafer in the exposure chamber 124 and the UV exposure on the entire upper surface may be performed on the wafer by the UV lamp 132. Next, the wafer may be transferred to the second load-lock chamber 110-2 by the robot 145. When the UV lamp 132 is disposed in the second load-lock chamber 110-2, EUV exposure may be performed on a wafer in the exposure chamber 124 and the wafer may be transferred to the second load-lock chamber 110-2 by the robot 145. Next, the UV exposure on the entire upper surface may be performed on the wafer by the UV lamp 132 in the second load-lock chamber 110-2.

In the EUV exposure system 100a according to the present example embodiment, the UV exposure apparatus 130 may include the UV lamp 132. For example, the UV lamp 132 may be disposed in the exposure chamber 124 or may be combined with the second load-lock chamber 110-2. For example, the EUV exposure system 100a according to the present example embodiment may perform the UV exposure on the entire upper surface of wafer in-situ after EUV exposure. As described above, the total time of an EUV exposure process (the EUV exposure and the UV exposure on the entire upper surface) may increase due to addition of the UV exposure on the entire upper surface. However, an EUV exposure time itself may be reduced because the UV exposure on the entire upper surface is performed in-situ and EUV exposure performance is improved. Therefore, the total time of the EUV exposure process in the EUV exposure system 100a may be maintained or reduced compared to an existing EUV exposure system.

Figure 4:
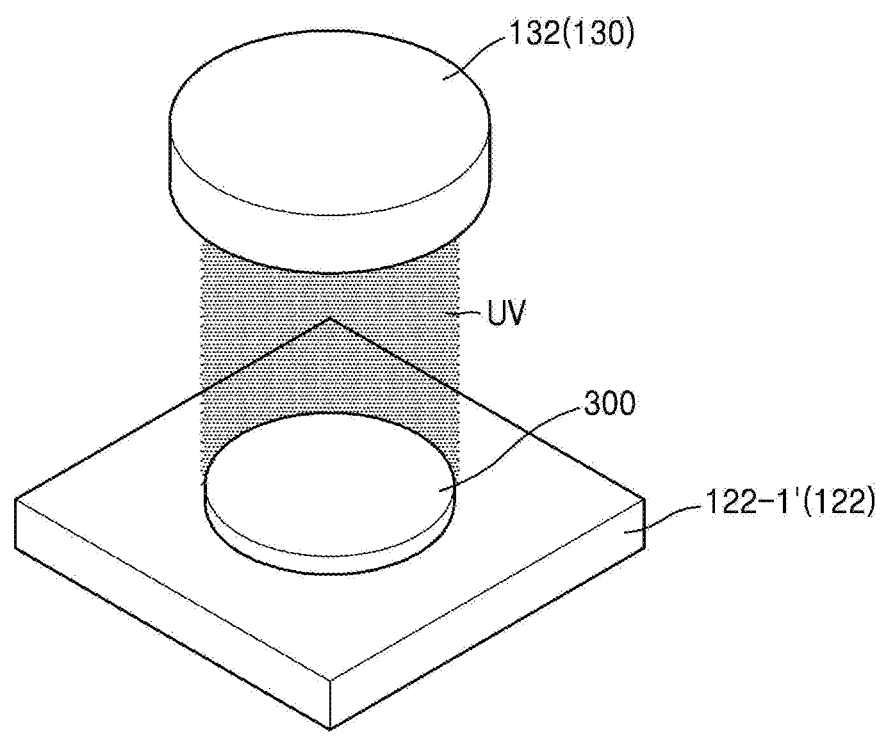
FIG. 4 is a detailed perspective view of the UV exposure apparatus of FIG. 3.

FIG. 3 is a schematic diagram of an example embodiment of forming the UV exposure apparatus 130 in the EUV exposure apparatus 120, in the EUV exposure system 100a of FIG. 2 according to an example embodiment of the inventive concept, and FIG. 4 is a detailed perspective view of the UV exposure apparatus 130 of FIG. 3.

Referring to FIGS. 3 and 4, the EUV exposure apparatus 120 may include the EUV light source 121, the chuck table 122, the optical system 125, and the EUV mask 126 in the exposure chamber 124.

The EUV light source 121 may generate a light within a wavelength range of an EUV light, for example, about 100 nm or less. The wavelength of the EUV light generated from the EUV light source 121 may be adjusted, e.g., by filtering, to an operating wavelength of the projection system 125-2, for example, 13.5 nm or 7 nm. In certain embodiments, the EUV light source 121 may be adjusted to generate a proper wavelength for the projection system 125-2 to use. For example, the EUV light source 121 may be configured to generate a proper wavelength for the projection system 125-2 to use, e.g., 13.5 nm or 7 nm. For example, a plasma light source or synchrotron light source may be used as the EUV light source 121. The plasma light source may be a laser-produced plasma (LPP) light source including tin (Sn) as a target and may use a CO2 laser as an excitation light source. As described above, power of the EUV light source 121 may be considerably less than that of an existing UV light source. For example, power of the EUV light source 121 may be about 80 W.

EUV exposure may be performed on a wafer 300 on the chuck table 122. The second chuck table 122-2 in a stand-by mode is not shown in FIG. 3, and a chuck table 122-1' under the UV lamp 132, which is the first chuck table 122-1 used for the EUV exposure, may move its position from under the projection system 125-2 to under the UV lamp 132 as indicated by a black arrow.

In the optical system 125, an EUV light generated from the EUV light source 121 may be incident to the EUV mask 126, and may irradiate the wafer 300 with an EUV light reflected by the EUV mask 126. The optical system 125 may include the lighting system 125-1 and the projection system 125-2.

The lighting system 125-1 may include a plurality of lighting mirrors and may irradiate the EUV mask 126 with the EUV light generated from the EUV light source 121. Since a structure of the lighting system 125-1 including a plurality of lighting mirrors is well-known to those of ordinary skill in the art, only a first lighting mirror 123 collecting EUV light generated from the EUV light source 121 and supplying the EUV light to another lighting mirror is illustrated and the other lighting mirrors are not shown as included in a square block of the lighting system 125-1 for convenience of descriptions.

The projection system 125-2 may irradiate the wafer 300 with the EUV light reflected by the EUV mask 126. Since a structure of the projection system 125-2 including a plurality of imaging mirrors is well-known to those of ordinary skill in the art, the imaging mirrors are not shown as included in a square block for convenience of descriptions.

The EUV mask 126 may be disposed on a mask stage 127. Although not shown in FIG. 3, a slit may be disposed under the EUV mask 126. The slit may partially limit EUV light from irradiating the EUV mask 126, and therefore, only a partial region of the EUV mask 126 is irradiated with the EUV light, e.g., in a region that the EUV light passes through the slit. The mask stage 127 may move in a direction opposite to a scanning direction during a scanning process, and the EUV light may irradiate a corresponding region of the EUV mask 126 while moving through the slit.

As illustrated in FIG. 3, the UV exposure apparatus 130 may include the UV lamp 132 disposed in the exposure chamber 124. UV exposure may be performed on the upper surface of the wafer 300 on which EUV exposure has been performed by using the UV lamp 132. The UV lamp 132 may generate and output a light within a wavelength of UV light. For example, the UV lamp 132 may be a mercury lamp, and may generate and output an I-line light with a wavelength of about 365 nm. The UV lamp 132 may have high output power of 500 W or more. For example, the UV exposure on the entire upper surface of the wafer 300 may be performed by using the UV lamp 132 having high output power of 500 W or more and may contribute to improvement of EUV exposure performance.

In FIG. 4, the UV lamp 132 illustrated as a cylinder shape is simplified to correspond to a shape of the wafer 300 However, the UV lamp 132 may include a complicated structure to generate a UV light. The UV lamp 132 may have various shapes besides the cylinder shape as long as a UV light is irradiated to the entire upper surface of the wafer 300.

In the present embodiment, the UV exposure on the entire upper surface is mainly described to be performed after the EUV exposure is performed in the EUV exposure systems, but the exposure after the EUV exposure is not limited to the UV exposure on the entire upper surface. In certain embodiments, deep UV (DUV) exposure may be performed on the entire upper surface after EUV exposure. A DUV lamp generating a light within a wavelength of a DUV light, for example, a KrF laser (248 nm) lamp, an ArF laser (193 nm) lamp, or an F2 laser (157 nm) lamp may be used for the DUV exposure. Whether to perform UV exposure or DUV exposure on the entire upper surface after EUV exposure may depend on characteristics of a PR formed on the wafer 300. For example, EUV exposure performance may be maximized by UV exposure or DUV exposure depending on chemical components of a PR. Therefore, UV exposure or DUV exposure on the entire upper surface may be appropriately selected depending on a chemical component of a PR. In certain embodiments, a UV exposure apparatus 130 may include a UV lamp together with a DUV lamp, and thus, may selectively perform UV exposure or DUV exposure on the entire upper surface by selecting corresponding lamps.

Hereinafter, a UV exposure apparatus or UV exposure on the entire upper surface without a photomask will be described in detail. However, a DUV exposure apparatus or DUV exposure on the entire upper surface without a photomask may also be applied to the EUV exposure system instead of the UV exposure apparatus or the UV exposure unless otherwise described.

Figure 5A:
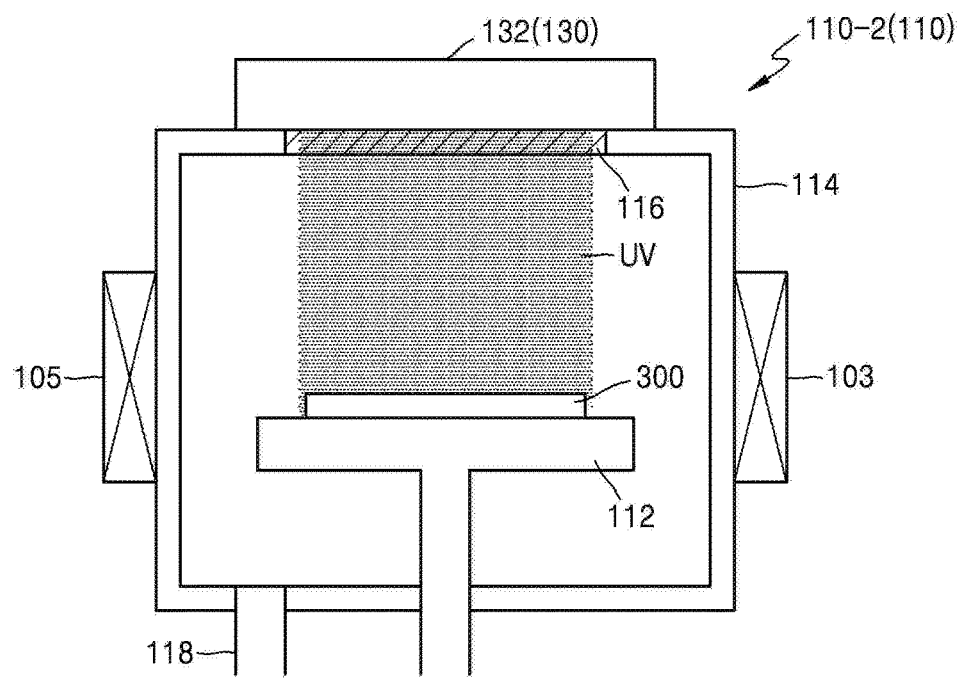
FIGS. 5A and 5B are respectively a schematic cross-sectional view and a schematic plan view of an example embodiment of forming the UV exposure apparatus in a load-lock chamber in the EUV exposure system of FIG. 2.
Figure 5B:
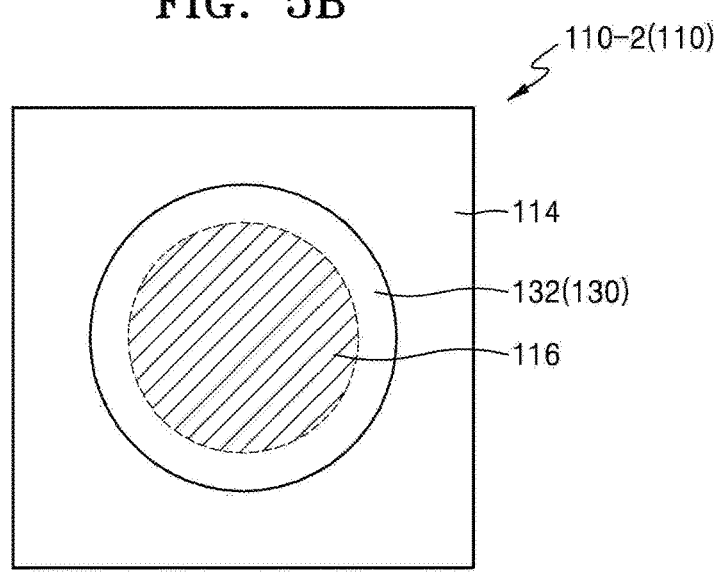

FIGS. 5A and 5B are respectively a schematic cross-sectional view and a schematic plan view of an example embodiment of forming the UV exposure apparatus in a load-lock chamber in the EUV exposure system 100a of FIG. 2 according to an example embodiment of the inventive concept.

Referring to FIGS. 5A and 5B, in the EUV exposure system according to the present example embodiment, the UV exposure apparatus 130 may be disposed outside or on a cover of the second load-lock chamber 110-2. For example, the input gate valve 105 and the output gate valve 103 may be respectively disposed on both side surfaces of the chamber cover or external wall 114 in the second load-lock chamber 110-2. The wafer 300 may be supplied to the second load-lock chamber 110-2 through the input gate valve 105 and may be discharged to outside through the output gate valve 103. The wafer 300 may have been exposed to EUV in the EUV exposure apparatus 120 (of FIG. 2 or FIG. 3) before the wafer 300 is exposed to the UV in the second load-lock chamber 110-2.

A chuck table 112 may be disposed in the second load-lock chamber 110-2 and the wafer 300 may be disposed on the chuck table 112. A pipe 118 connected to a vacuum pump may be disposed under a lower plate of the chamber cover or external wall 114. The inside of the second load-lock chamber 110-2 may be changed to a vacuum state when the vacuum pump discharges air from the second load-lock chamber 110-2 to outside through the pipe 118.

A transparent window 116 may be disposed on an upper plate of the chamber cover or external wall 114. For example, an upper portion of the chamber cover 114 may be formed of a transparent window 116. The upper plate of the chamber cover or external wall 114 and the transparent window 116 may form an upper cover of the second load-lock chamber 110-2. The transparent window 116 may include a material transmitting light, for example, a UV light.

The UV lamp 132 of the UV exposure apparatus 130 may be outside the second load-lock chamber 110-2. For example, the UV lamp 132 may be disposed on an outer surface of the upper plate of the chamber cover or external wall 114, e.g., on a position where the transparent window 116 is located. Therefore, a UV light of the UV lamp 132 may irradiate the entire upper surface of the wafer 300 after passing through the transparent window 116.

FIG. 5B is a plan view of the second load-lock chamber 110-2, and illustrates relative sizes of the UV lamp 132 on the upper plate of the chamber cover or external wall 114 and the transparent window 116 under the UV lamp 132. For example, a horizontal cross-sectional area of the UV lamp 132 may be greater than that of the transparent window 116. However, the inventive concept is not limited thereto and the horizontal cross-sectional area of the transparent window 116 may be greater than that of the UV lamp 132. For example, horizontal cross-sectional shapes of the transparent window 116 and the UV lamp 132 are not limited to a circular shape, and may have various shapes such as a square shape or an oval shape.

For example, a vacuum state may be maintained in the second load-lock chamber 110-2 when the UV exposure is performed on the entire upper surface of the wafer 300 by using the UV exposure apparatus 130. For example, the UV exposure on the entire upper surface may be performed in-situ. After this, the second load-lock chamber 110-2 may be provided with a gas to become an atmospheric pressure state and the wafer 300 may be transferred to the spinner 200 (of FIG. 2).

Figure 6:
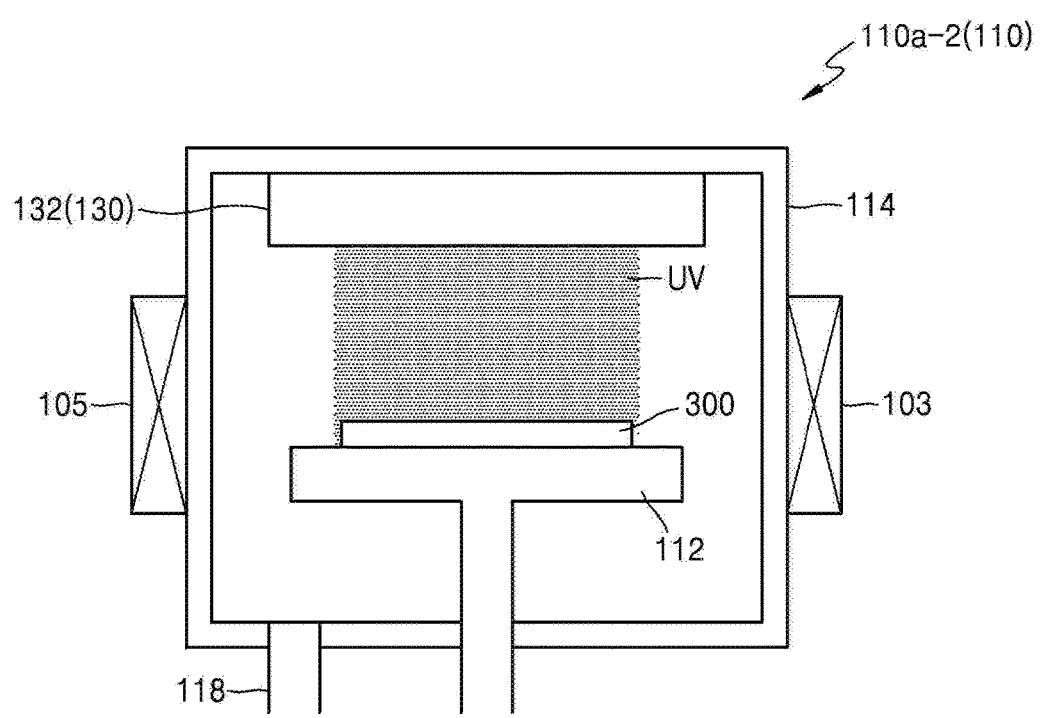
FIG. 6 is a schematic cross-sectional view of an example embodiment of forming the UV exposure apparatus in the load-lock chamber in the EUV exposure system of FIG. 2.

FIG. 6 is a schematic cross-sectional view of an example embodiment of installing the UV exposure apparatus 130 in the load-lock chamber 110, in the EUV exposure system 100a of FIG. 2 according to an example embodiment of the inventive concept. In FIG. 6, like reference numerals in FIGS. 5A and 5B denote like elements, and repeated descriptions thereof are omitted.

Referring to FIG. 6, in the EUV exposure system according to the present example embodiment, the UV exposure apparatus 130 may be disposed in the second load-lock chamber 110-2. For example, the UV lamp 132 of the UV exposure apparatus 130 may be arranged on an inner surface of the upper plate of the chamber cover or external wall 114. Since the UV lamp 132 is disposed in the second load-lock chamber 110-2, a transparent window may not be disposed on the upper plate of the chamber cover or external wall 114. For example, the whole area of the upper cover of the load-lock chamber 110-2 may be opaque.

In the EUV exposure system according to the present example embodiment, the UV exposure on the entire upper surface of the wafer 300 by using the UV exposure apparatus 130 may be performed in-situ. For example, a vacuum state may be maintained in the second load-lock chamber 110-2 during the UV exposure.

Figure 7:
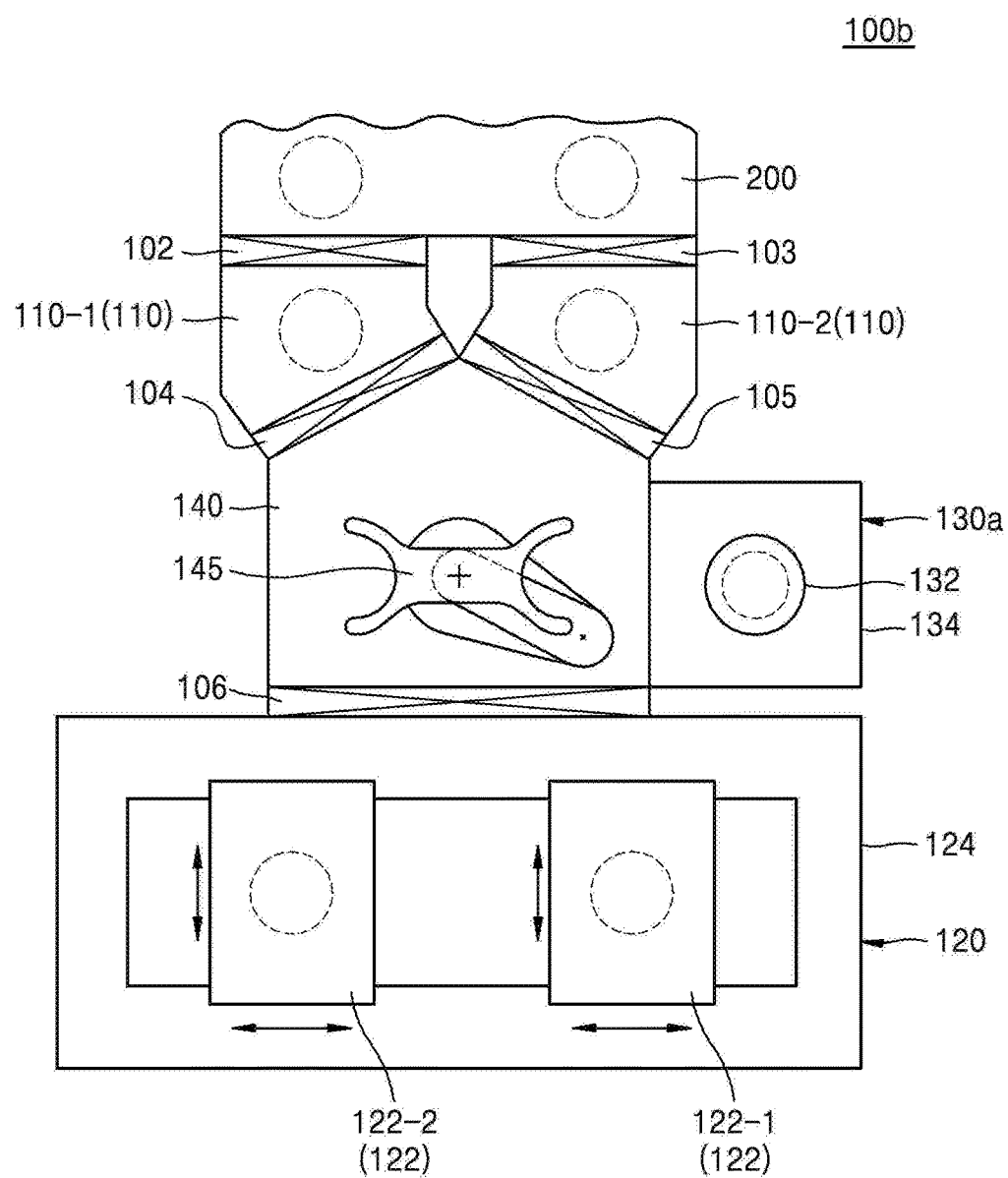
FIG. 7 is a schematic view of the EUV exposure system of FIG. 1, according to an example embodiment of the inventive concept.

FIG. 7 is an exemplary schematic view of the EUV exposure system 100 of FIG. 1, according to an example embodiment of the inventive concept. In FIG. 7, like reference numerals in FIG. 2 denote like elements, and repeated descriptions thereof are omitted.

Referring to FIG. 7, an EUV exposure system 100b according to the present example embodiment may be different from the EUV exposure system 100a of FIG. 2 in that a UV exposure apparatus 130a is formed to be of a separate chamber type. For example, the UV exposure apparatus 130a may include a UV chamber 134, a chuck table (not shown), and a UV lamp 132. The UV lamp 132 may be disposed inside or outside the UV chamber 134. When the UV lamp 132 is disposed outside, a transparent window may be disposed on an upper plate or cover of the UV chamber 134.

When the UV exposure is performed in the UV exposure apparatus 130a, a vacuum state may be maintained in the UV chamber 134. Since the inside of the wafer exchange chamber 140 generally is maintained a vacuum state, the UV exposure apparatus 130a may be combined with the wafer exchange chamber 140, in which the UV chamber 134 is open toward the wafer exchange chamber 140 without a gate valve. However, in certain embodiments, the UV exposure apparatus 130a may be combined with the wafer exchange chamber 140 through a gate valve and a separate vacuum state may be obtained in the UV exposure apparatus 130a by using a vacuum pump.

A wafer on which EUV exposure has been performed may be transferred from the exposure chamber 124 to the UV chamber 134, and the UV exposure on the entire upper surface of the wafer may be performed without a photomask in the UV chamber 134. The wafer on which the UV exposure has been performed may be transferred to the second load-lock chamber 110-2. For example, the wafer may be transferred by the robot 145.

So far, example embodiments of disposing the UV exposure apparatuses 130 and 130a in the exposure chamber 124 or the second load-lock chamber 110-2, or of using a separate chamber type have been described. However, a location or a structure of disposing a UV exposure apparatus is not limited thereto. For example, in the EUV exposure system according to the present example embodiment, a UV exposure apparatus may be disposed in various parts of the EUV exposure system with various structures as long as UV exposure is performed on a wafer in-situ after EUV exposure. For example, if a sufficient space is available in the wafer exchange chamber 140, a UV exposure apparatus may be realized by including a chuck table and a UV lamp in the wafer exchange chamber 140. In the present embodiment, a separate chamber may not be used to realize a UV exposure apparatus in the exposure chamber 124 or the second load-lock chamber 110-2. A chuck table for supporting a wafer may be included in the wafer exchange chamber 140 to realize a UV exposure apparatus in the wafer exchange chamber 140.

Figure 8:
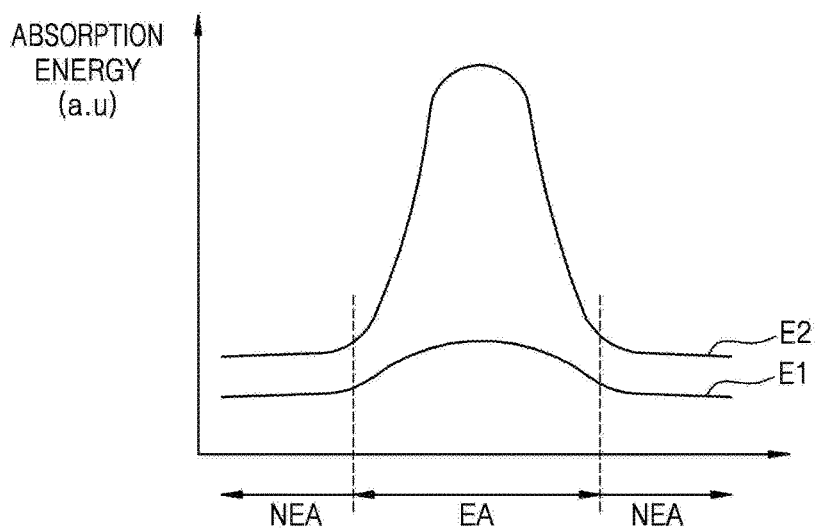
FIG. 8 is a graph illustrating a principle of improving the exposure performance of EUV exposure systems according to example embodiments of the inventive concept.

FIG. 8 is a graph illustrating a principle of improving the exposure performance of EUV exposure systems according to example embodiments of the inventive concept, wherein an x-axis indicates an exposure area EA and a non-exposure area NEA of a PR on a wafer, and a y-axis indicates the amount of energy absorbed by the PR and that a unit thereof may be an arbitrary unit. Here, E1 may be a graph of energy absorbed in the PR after EUV exposure is performed, and E2 may be a graph of energy absorbed in the PR on which UV exposure on the entire upper surface is performed after EUV exposure is performed.

Referring to FIG. 8, in the graph E1, a difference is not great between the energy absorbed in an exposure area EA of the PR and the energy absorbed in a non-exposure area NEA of the PR after EUV exposure is performed. The exposure area EA may be an area to which an EUV light with a high intensity is irradiated and the non-exposure area NEA may be an area to which an EUV light is not irradiated or an EUV light with a low intensity is irradiated. For example, the energy absorbed in the PR may be used to change chemical characteristics of the PR. For example, when the PR is a positive resist material including a photo acid generator (PAG), an acid may be generated from the PAG by irradiating light thereon, and an area to which light is irradiated, that is, the exposure area EA may change its chemical characteristics to alkali-soluble characteristics by acid action. Afterwards, the exposure area EA may be removed through an alkali developing solution during a developing process.

For example, the more obvious a difference between chemical characteristics of the exposure area EA and that of the non-exposure area NEA is, the better PR patterning in the developing process is. For example, the PR patterning quality may depend on the degrees of reaction between irradiated light energy and the PR in the exposure area EA and the non-exposure area. Therefore, the greater a difference between chemical characteristics of the exposure area EA and that of the non-exposure area NEA is by an exposure process, the better exposure performance may be. The difference of chemical characteristics between the exposure area EA and the non-exposure area NEA may depend on an amount of absorbed light energy during the exposure process. As shown in FIG. 8, in a case of EUV exposure, a difference between the energy absorbed in the exposure area EA and the energy absorbed in the non-exposure area NEA may not be great. Therefore, the difference of chemical characteristics may not be great and exposure performance may not be good. The low exposure performance of EUV exposure may be due to low output power of an EUV light source.

E2 in FIG. 8 shows that the difference is great between the energy absorbed in the exposure area EA and the energy absorbed in the non-exposure area NEA of the PR on which the UV exposure on the entire upper surface of the wafer is performed after EUV exposure is performed. An increase in the difference of the absorbed energy may result in an increase in the difference of the chemical characteristics, and thus, may contribute to improvement of exposure performance of an EUV exposure process.

Although an accurate mechanism of a remarkable increment of energy absorption in the exposure area EA during the UV exposure process on the entire upper surface of a wafer after EUV exposure is performed is not clear, it is verified experimentally, and it is presumed that energy absorption is accelerated in a region where chemical characteristics are changed by an EUV light and a change in chemical characteristics is amplified by the UV exposure.

Figure 9:
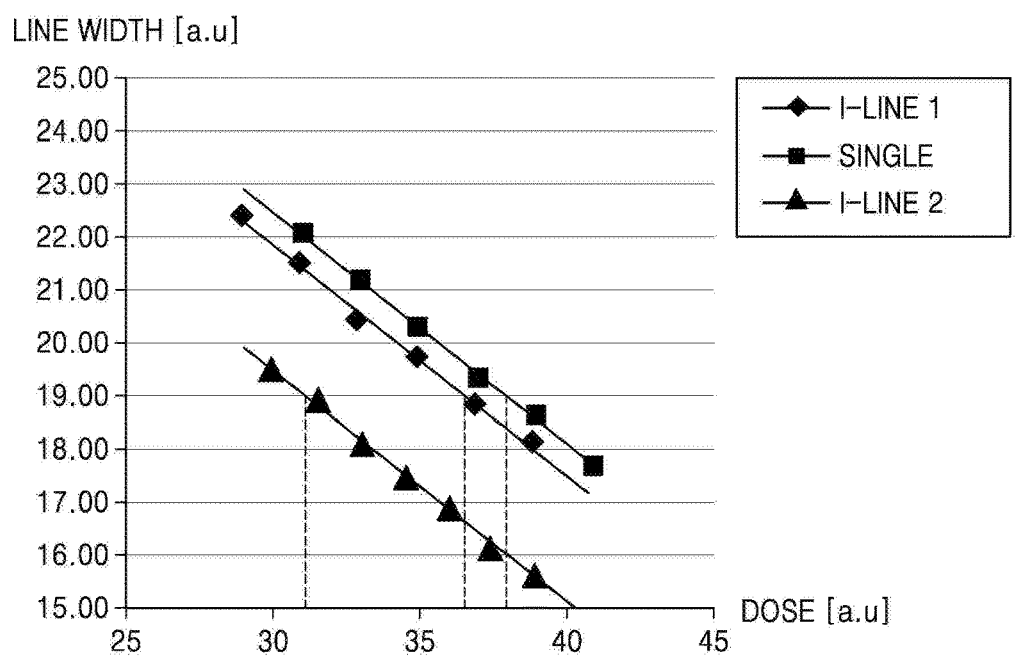
FIG. 9 is a graph for comparing the exposure performance of EUV exposure systems according to example embodiments of the inventive concept with that of an existing EUV exposure system.

FIG. 9 is a graph for comparing the exposure performance of EUV exposure systems according to example embodiments of the inventive concept with that of an existing EUV exposure system, wherein an x-axis indicates doses of EUV light and that a unit thereof may be an arbitrary unit, and a y-axis indicates line widths of patterns and that a unit thereof may be nm. "Single" indicates a graph that EUV exposure is performed without a UV exposure, and "I-line 1" and "I-line 2" indicate graphs that UV exposure is performed with a first UV dose and a second UV dose along with the EUV exposure, respectively. The second UV dose may be ten times or greater than the first UV dose.

Referring to FIG. 9, performing UV exposure on the entire upper surface after EUV exposure (I-line 1 and I-line 2) may reduce an EUV dose to produce the same patterns as an EUV-only exposure process (single in FIG. 9) does. For example, when a line width of 19 nm is realized and EUV exposure is performed (Single), an EUV dose of about 38 may be used. Also, an EUV dose of about 36 may be used when UV exposure on the entire surface is performed together with the first UV dose (I-line 1), and an EUV dose of about 31 may be used when UV exposure on the entire surface is performed together with the second UV dose (I-line 2). Therefore, a same patterning quality may be obtained with a smaller EUV dose by performing UV exposure on the entire upper surface after EUV exposure. For example, a finer pattern may be realized with the same EUV dose be adding UV exposure on the entire upper surface after EUV exposure.

A dose may be expressed as $J/cm^2$ or $mJ/cm^2$ in an exposure process, and may be converted to length of time. For example, if 100 $mJ/cm^2$ of EUV light energy is used to expose a wafer, it may take 100 msec, and if 1000 $mJ/cm^2$ of EUV light energy is used to expose a wafer, it may take 1000 msec. Therefore, as a smaller dose of EUV energy is used for an exposure, the corresponding process time may be reduced. As a result, by performing an additional UV exposure, an EUV exposure processing time may be reduced while maintaining a patterning quality at the same level as the process performing EUV-only exposure (Single in FIG. 9).

An exposure processing time may be increased by adding an UV exposure process on the entire upper surface after an EUV exposure. In the present embodiment, because the EUV exposure time itself may be reduced, the total time (a sum of an EUV exposure time and an UV exposure time) of the EUV exposure process may not be increased. In certain embodiments, a wafer is exposed to UV by the UV exposure apparatus 130 while another wafer is exposed to EUV by the EUV exposure apparatus 120. Therefore, the exposure processing time may be reduced. For example, the EUV exposure process according to the present example embodiment may improve exposure performance while maintaining a patterning quality. Therefore, production of the EUV exposure process may be increased.

Figure 10:
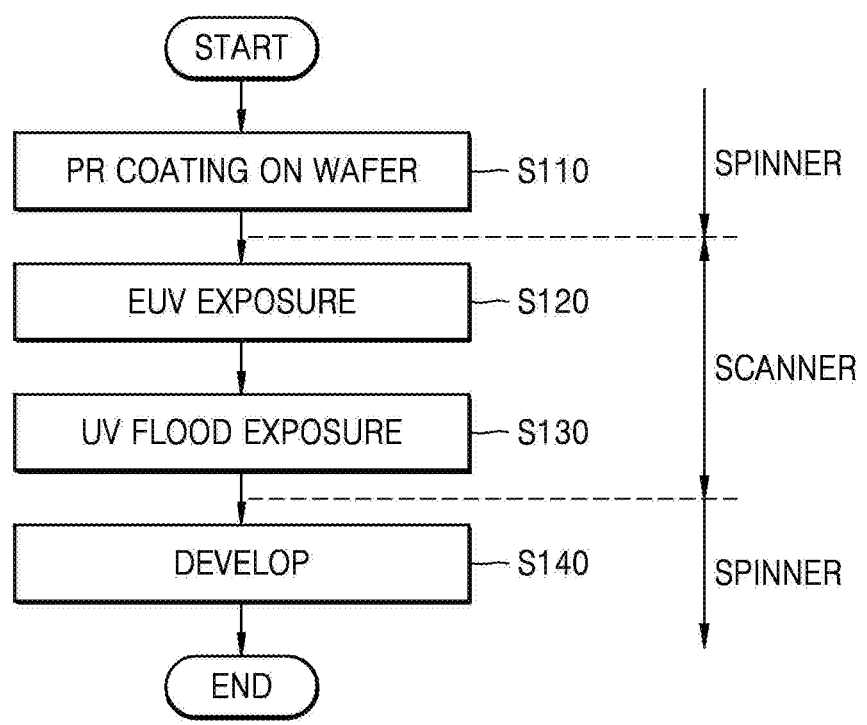
FIG. 10 is a flowchart of an EUV photolithography process according to an example embodiment of the inventive concept.

FIG. 10 is a flowchart of an EUV photolithography process according to an example embodiment of the inventive concept. FIG. 10 is described with reference to FIG. 1 or FIG. 2 and repeated descriptions thereof are omitted for convenience of description.

Referring to FIG. 10, in operation S110, a PR layer is coated on a wafer. The PR coating may be performed by, for example, the spinner 200. The wafer may be a pure semiconductor wafer or may be a semiconductor wafer on which a predetermined material layer is formed. After the PR coating on the wafer is completed, the wafer may be transferred to the EUV exposure apparatus 120 via the load-lock chamber 110.

In operation S120, the EUV exposure apparatus 120 may perform EUV exposure on the wafer. The EUV exposure operation may be performed by making an EUV light of the EUV light source 121 (of FIG. 3) incident on the EUV mask 126 through the lighting system 125-1 (of FIG. 3) and irradiating the upper surface of the wafer with the EUV light reflected by the EUV mask 126 and transferring through the projection system 125-2 (of FIG. 3).

In operation S130, the UV exposure apparatus 130 may perform UV exposure on the entire upper surface of the wafer on which EUV exposure has been performed. As described above, the UV exposure apparatus 130 may be disposed in the exposure chamber 124 or the second load-lock chamber 110-2 in a form of including only the UV lamp 132 or in a form of including the UV lamp 132 and a chuck table in a separate chamber as described above. The UV exposure on the entire upper surface of the wafer may be performed with the EUV exposure in-situ. After the UV exposure on the entire upper surface of the wafer is completed, the wafer may be transferred to the spinner 200 via the load-lock chamber 110-2.

In operation S140, the spinner 200 may perform a developing process of the PR layer. A pattern may be formed with the PR layer on the wafer through the developing process. Although not shown in FIG. 10, the EUV photolithography process may further include a cleaning process and a baking process after the developing process.

Dashed lines distinguish the EUV exposure and the UV exposure on the entire upper surface performed in the EUV exposure systems 100 and 100a from the PR coating process and the developing process performed in the spinner 200, wherein the EUV exposure systems 100 and 100a are each represented as a scanner for the sake of convenience. Therefore, the present embodiment should not be limited by the scanner. For example, a stepper or another may be used for the EUV exposure process.

Figure 11:
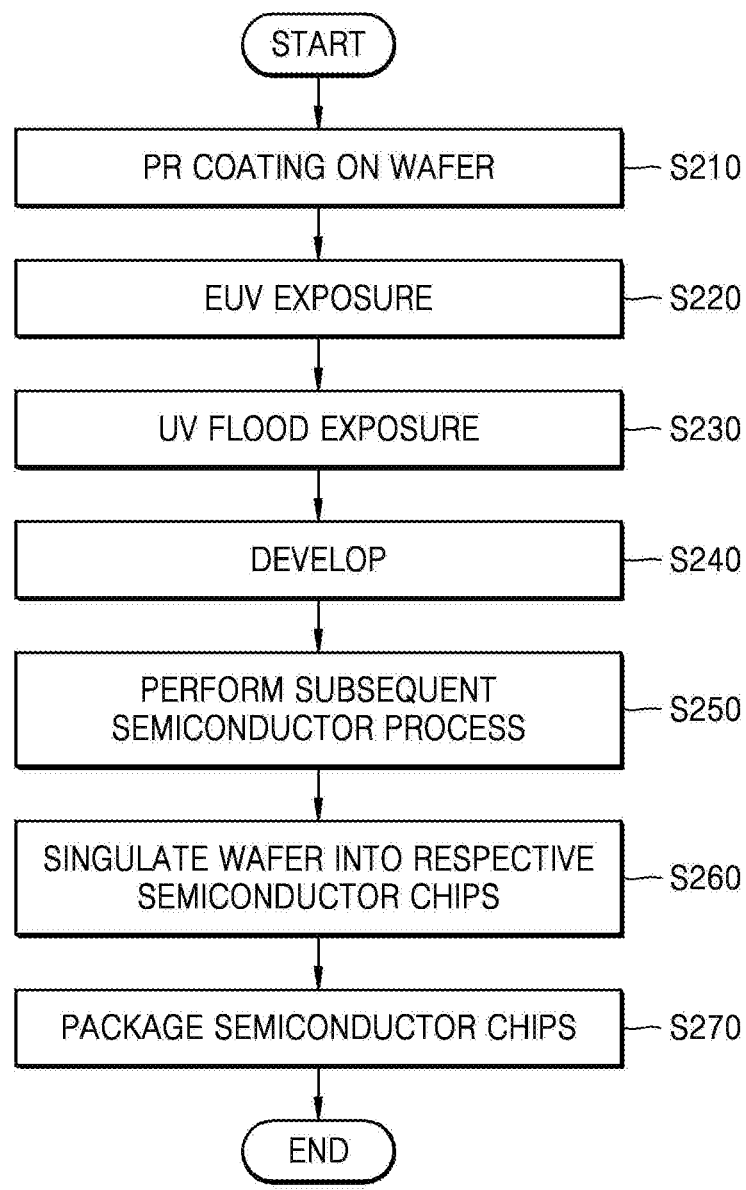
FIG. 11 is a flowchart of a process of manufacturing a semiconductor device through an EUV photolithography process according to an example embodiment of the inventive concept.

FIG. 11 is a flowchart of a process of manufacturing a semiconductor device including EUV photolithography exposure according to an example embodiment of the inventive concept. In FIG. 11, like reference numerals in FIG. 10 denote like elements, and repeated descriptions thereof are omitted.

Referring to FIG. 11, an EUV photolithography process may be performed by progressing from a PR coating operation (S210) to a developing operation (S240) as described in regard to FIG. 10 above.

In operation S250, a subsequent semiconductor process may be performed on a wafer. The subsequent semiconductor process may include various processes. For example, the subsequent semiconductor process may include a process of etching a lower material layer of the wafer by using a PR pattern obtained through the EUV photolithography process described above. The subsequent semiconductor process may include a deposition process, an etching process, an ion process, and/or a cleaning process. The etching process may use the EUV photolithography process or other photolithography processes. The etching process may be performed without a separate photolithography process. Integrated circuits and wirings for a corresponding semiconductor device may be formed by performing the subsequent semiconductor process. The subsequent semiconductor process may include a test process for a semiconductor device at a wafer level.

In operation S260, after the subsequent semiconductor process, the wafer may be individualized into each of semiconductor chips. The individualization of the wafer into each of semiconductor chips may be performed through a sawing process by using a blade or a laser.

In operation S270, a packaging process for the semiconductor chips may be performed. The packaging process may be a process of mounting the semiconductor chips on a printed circuit board (PCB) and sealing the semiconductor chips with a sealing member. The packaging process may include a process of stacking a plurality of semiconductors on the PCB in multiple layers and forming a stack package, or a process of stacking a stack package on the stack package and forming a package-on-package (POP) structure. A semiconductor device or a semiconductor package may be completed through the packaging process for the semiconductor chips. Additionally, a test process for the semiconductor package may be performed after the packaging process.

While the inventive concept has been particularly shown and described with reference to example embodiments thereof, it will be understood that various changes in form and details may be made therein without departing from the spirit of the description and scope of the invention should be determined by the following claims.

What is claimed is:

1. An EUV exposure system comprising:
   an extreme ultraviolet (EUV) exposure apparatus configured to perform EUV exposure on a wafer disposed on a chuck table;
   a first load-lock chamber combined with the EUV exposure apparatus and configured to discharge the wafer to/from the EUV exposure apparatus;
   an ultraviolet (UV) exposure apparatus configured to perform UV exposure by irradiating a UV light to an entire upper surface of the wafer, wherein the UV exposure apparatus does not include a mask holder; and
   a second load-lock chamber configured to supply the wafer to the EUV exposure apparatus,
   wherein the UV exposure apparatus is disposed in the first load-lock chamber.

2. The EUV exposure system of claim 1, wherein the UV exposure apparatus comprises a UV lamp configured to generate the UV light.

3. The EUV exposure system of claim 1, wherein the UV exposure apparatus comprises a UV lamp configured to generate the UV light, and
   the UV lamp is disposed inside the first load-lock chamber.

4. The EUV exposure system of claim 1, wherein the UV exposure apparatus comprises a UV lamp configured to generate the UV light,
   wherein the first load-lock chamber comprises a transparent window formed on an upper cover of the first load-lock chamber, the transparent window configured to transmit the UV light,
   wherein the UV lamp is disposed on an upper portion of the transparent window outside the first load-lock chamber, and
   the UV lamp is configured to irradiate the wafer disposed inside the second load-lock chamber with the UV light after the UV light passes through the transparent window.

5. The EUV exposure system of claim 1, wherein the UV exposure apparatus comprises at least two lamps configured to generate lights having different wavelengths.

6. The EUV exposure system of claim 1, wherein the UV exposure apparatus comprises at least one of a UV lamp configured to generate an I-line light and a deep UV (DUV) lamp configured to generate a DUV light.

7. The EUV exposure system of claim 1, wherein the EUV exposure apparatus comprises an EUV lamp configured to generate an EUV light, an EUV mask comprising a pattern configured to be transferred to the wafer, an optical system configured to transmit the EUV light generated from the EUV lamp to the EUV mask and further configured to transmit the EUV light reflected by the EUV mask to the wafer disposed on the chuck table,
   the UV exposure apparatus comprises a UV lamp, and
   the chuck table is one of at least two chuck tables and at least one of the chuck tables is configured to be transferred to a location corresponding to the UV lamp.

8. An EUV exposure system comprising:
   an extreme ultraviolet (EUV) exposure apparatus configured to perform EUV exposure on a wafer disposed on a chuck table;
   a first load-lock chamber combined with the EUV exposure apparatus and configured to supply the wafer into the EUV exposure apparatus;
   a second load-lock chamber combined with the EUV exposure apparatus and configured to discharge the wafer from the EUV exposure apparatus to outside of the EUV exposure apparatus; and
   a UV exposure apparatus disposed in the EUV exposure apparatus or the second load-lock chamber and configured to perform UV exposure on the wafer,
   wherein the UV exposure apparatus comprises a UV lamp configured to generate a UV light,
   wherein an upper cover of the second load-lock chamber comprises a transparent window capable of transmitting the UV light,
   wherein the UV lamp is disposed on an upper portion of the transparent window outside the second load-lock chamber, and
   wherein the UV lamp is configured to irradiate the wafer with the UV light while the wafer is disposed inside the second load-lock chamber.

9. The EUV exposure system of claim 8, wherein the UV exposure apparatus is configured to perform UV exposure by irradiating a UV light to an entire upper surface of the wafer without using a mask.

10. The EUV exposure system of claim 8, wherein the UV exposure apparatus is disposed in the EUV exposure apparatus, and
    the UV exposure apparatus is configured to perform the UV exposure on the entire upper surface of the wafer after the EUV exposure is performed on the upper surface of the wafer with a photomask.

11. The EUV exposure system of claim 8, wherein the UV exposure apparatus comprises at least one of a UV lamp configured to generate an I-line light and a deep UV (DUV) lamp configured to generate a DUV light, and
    the UV exposure apparatus is configured to perform the UV exposure on the entire upper surface of the wafer via the UV lamp or the DUV lamp.

12. An apparatus comprising:
    an EUV exposure chamber comprising a chuck table, an extreme ultraviolet (EUV) light source configured to emit EUV light and a mask holder being positioned between the EUV light source and the chuck table;
    an ultraviolet (UV) light source configured to emit UV light; and
    a load-lock chamber connected to the EUV exposure chamber by a gate valve,
    wherein the EUV light source is positioned to expose a photoresist (PR) layer coated on a wafer to an EUV light emitted from the EUV light source that is transferred via a photomask held by the mask holder,
    wherein the load-lock chamber is configured such that PR layer is exposed to the UV light within the load-lock chamber,
    wherein the gate valve is configured to isolate a vacuum inside the EUV exposure chamber from an atmospheric pressure in the load-lock chamber, and
    wherein the UV light source is configured to expose the PR layer to a UV light emitted from the UV light source without using a photomask after the PR layer is exposed to the EUV light.

13. The apparatus of claim 12, wherein the EUV exposure and the UV exposure are performed in a vacuum state.

14. The apparatus of claim 12, wherein the UV light is a deep UV (DUV) light.

15. The apparatus of claim 12, wherein the EUV exposure chamber is configured such that the PR layer is exposed to the UV light within the EUV exposure chamber.

16. The apparatus of claim 12, wherein the UV light is an I-line light.

17. The EUV exposure system of claim 8, wherein the UV exposure apparatus comprises a UV lamp configured to generate an I-line light.

\* \* \* \* \*